Inventors,
John A. Joslyn,
David A. Citrin,
by John F. McDevitt
Their Attorney.

Inventors,
John A. Joslyn,
David A. Citrin,
by John F. McDevitt
Their Attorney.

Inventors,
John A. Joslyn,
David A. Citrin,
by John F. McDevitt
Their Attorney.

Inventors,
John A. Joslyn,
David A. Citrin,
by John F. McDevitt
Their Attorney.

Aug. 18, 1970 J. A. JOSLYN ET AL 3,525,029

PULSE WIDTH MODULATION POWER SWITCHING SERVO AMPLIFIER AND MECHANISM

Filed Jan. 3, 1967 10 Sheets-Sheet 5

Inventors,
John A. Joslyn,
David A. Citrin.
by John F. McDevitt
Their Attorney.

Inventors,
John A. Joslyn,
David A. Citrin.
by John F. McDevitt
Their Attorney.

Inventors,
John A. Joslyn,
David A. Citrin,
by John F. McDevitt
Their Attorney.

Inventor,
John A. Joslyn,
David A. Citrin,
by John F. McDevitt
Their Attorney.

Inventors,
John A. Joslyn,
David A. Citrin,
by John F. McDevitt
Their Attorney.

Inventors,
John A. Joslyn,
David A. Citrin,
by John F. McDevitt
Their Attorney.

United States Patent Office 3,525,029

Patented Aug. 18, 1970

3,525,029

PULSE WIDTH MODULATION POWER SWITCHING SERVO AMPLIFIER AND MECHANISM

John A. Joslyn and David A. Citrin, Dalton, Mass., assignors to General Electric Company, a corporation of New York Filed Jan. 3, 1967, Ser. No. 606,806
Int. Cl. G05b *9/02*
U.S. Cl. 318—599 14 Claims

ABSTRACT OF THE DISCLOSURE

A bridge power amplifier including a protection circuit for preventing misconduction of the active power switching element of the bridge and short circuit conditions. The protection circuit comprises corner logic circuit means for each of the power semiconductor switching means to be turned on and off including lockout circuit means operatively intercoupling the corner logic circuit means of the upper and lower power semiconductor switching means on the same side of the bridge for positively preventing conduction of one while the other is conducting and vice versa. Lockout is achieved through suitable feedback inhibiting signals applied to and developed by the lockout circuit means whereby turn-on of a power semiconductor switching means on one side of the bridge is delayed until the other power semiconductor switching means on the same side of the bridge is fully off. In a preferred embodiment, compensation circuit means are operatively associated with the lockout circuit means to compensate for voltage drop in the switching semiconductors thereby reducing power dissipation losses. A shunt feedback network for the bridge is not subject to common mode switching current flow in the load which tends to obscure the feedback signal value.

This invention relates to a new and improved pulse width modulation power switching servo amplifier and mechanism.

More particularly, the invention relates to a servo switching power amplifier of the bridge type and includes features for preventing misconduction of the active power switching elements of the bridge, a new pulse turn on circuit arrangement providing compensation for the saturation impedance of the active power switching elements of the bridge, and an improved feedback signal deriving arrangement for developing a feedback signal for system stabilization purposes.

One known type of switching power servo amplifier utilizes at least four active switching elements (preferable power semiconductor devices having control electrodes) to connect a load across alternate terminals of a power supply. An example of a known bridge type power switching servo amplifier of this nature is disclosed in U.S. patent application Ser. No. 611,521 filed Dec. 23, 1966, H. I. Broverman, inventor, entitled "New and Improved Pulse Width Modulation Servo Amplifier and Mechanism," assigned to the General Electric Company. In bridge type switching power amplifiers, diagonally opposed power switching elements are caused to conduct current through the load in a given direction with one set of diagonally opposed elements causing load current flow, and the remaining set of diagonally opposed elements allowing load current flow in the reverse direction. By controlling the conducting intervals of the sets of diagonally opposed power switching elements, current flow through the load can be proportionally controlled.

One of the difficulties encountered with bridge type switching power amplifiers of the above described character is the occasional misfiring of the power switching elements on the same side of the bridge. Upon such an occurrence a short circuit is produced across the power supply and can result in damage to the power switching elements, etc. To avoid such occurrences, the present invention was devised.

Another difficulty encountered with bridge type switching power amplifiers concerns the development of a suitable feedback signal for use in system stabilizing feedback networks. With such bridge type circuits there is a common mode switching current flowing in the load that tends to obscure the real signal desired for feedback purposes. The present invention provides an improved feedback signal deriving network that overcomes this difficulty.

In switching power amplifiers it is a usual practice to turn the active power switching elements comprising a part of the circuit either fully on or off. This is done to minimize circuit loses and power dissipation. However, most power semiconductor switching devices exhibit some voltage drop even in the fully on saturated condition which increases the losses and power dissipation of the circuit. The present invention provides a novel compensation scheme for overcoming and minimizing the effect of such losses.

It is therefore a primary object of the present invention to provide a new and improved bridge type power switching amplifier having a positive lock out between the upper and lower corners on the same side of the bridge type switching power servo amplifier to prevent misfiring and short circuit conditions.

Another object of the invention is the provision of a new and improved compensating turn on circuit for power semiconductor switching devices which compensates for at least part of the saturated voltage drop of such devices.

A still further object of the invention is to provide a new and improved bridge type power switching amplifier having a novel shunt feedback signal deriving circuit arrangement.

In practicing the invention a pulse width modulation switching power amplifier of the bridge type is provided and has at least four controlled power semiconductor switching means connected bridge fashion with a load and a power source. The bridge type switching power amplifier serves to couple the load across alternate output terminals of the power source in accordance with the polarity and magnitude of an applied input control signal to thereby proportionally control load current flow through the load. Corner logic circuit means are provided for each of the power semiconductor switching means for causing the power semiconductor switching means to be turned on and off. The improved circuit is completed by a lock out circuit means operatively intercoupling the corner logic circuit means of the upper and lower power semiconductor switching means on the same side of the bridge for preventing conduction of one while the other is conducting and vice versa.

The invention further contemplates the use of a feedback deriving shunt impedance connected in at least two adjacent legs of the bridge for deriving a feedback signal for system stabilization purposes irrespective of the direction of current flow through the load. Summing amplifier means are provided which have the feedback signal derived across each of the shunt impedances supplied thereto for selecting and utilizing one of the shunt derived signals as a system feedback signal. The arrangement is completed by shunt control means which are operatively coupled across the input of the summing amplifier means in parallel with the respective shunt feedback signals for selectively passing one of the feedback signals to the summing amplifier means as determined by the mode of operation of the switching power amplifier.

In preferred embodiments of the invention, driver amplifier means are provided for operatively coupling turn on switching signals to the control electrodes of the power semiconductor switching devices employed in the bridge type switching power amplifier. Differential circuit means are also provided for deriving a pair of complementary turn on signals from a reference source of switching signals and the input control signal. The driver amplifier means is comprised by a pair of parallel connected switching transistors coupled intermediate the differential circuit means and the power semiconductor switching devices for recombining the complementary turn on signals supplied thereto from the differential circuit means and applying the combined signals to the control electrodes of the power semiconductor switching devices. The collector electrodes of the driver amplifier means have transformer secondaries connected in a manner such that they compensate for at least part of the saturated voltage of the power semiconductor switching devices.

Other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein.

Figure 1:
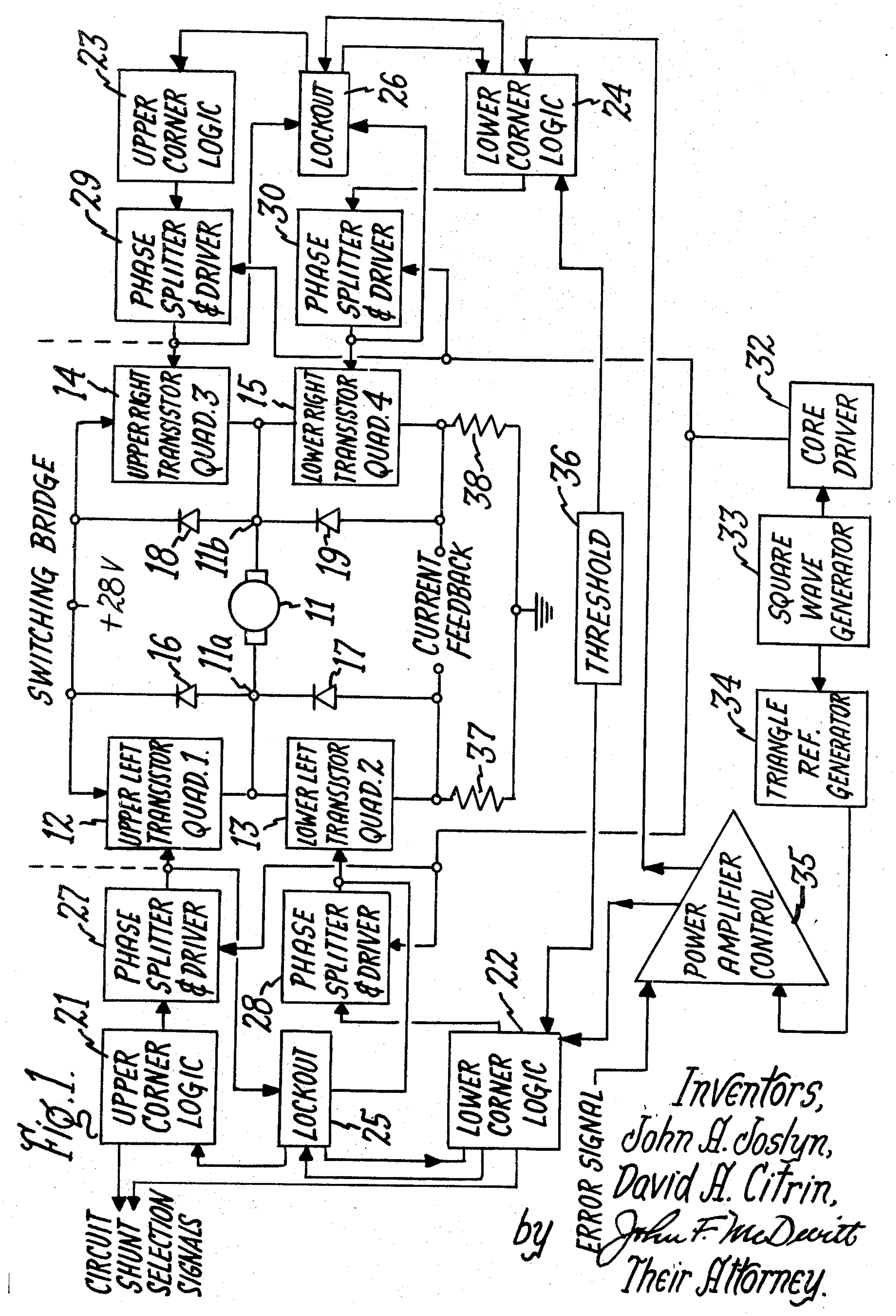
FIG. 1 is a functional block diagram of a new and improved bridge type pulse width modulation power switching servo amplifier and mechanism constructed in accordance with the invention.
Figure 9:
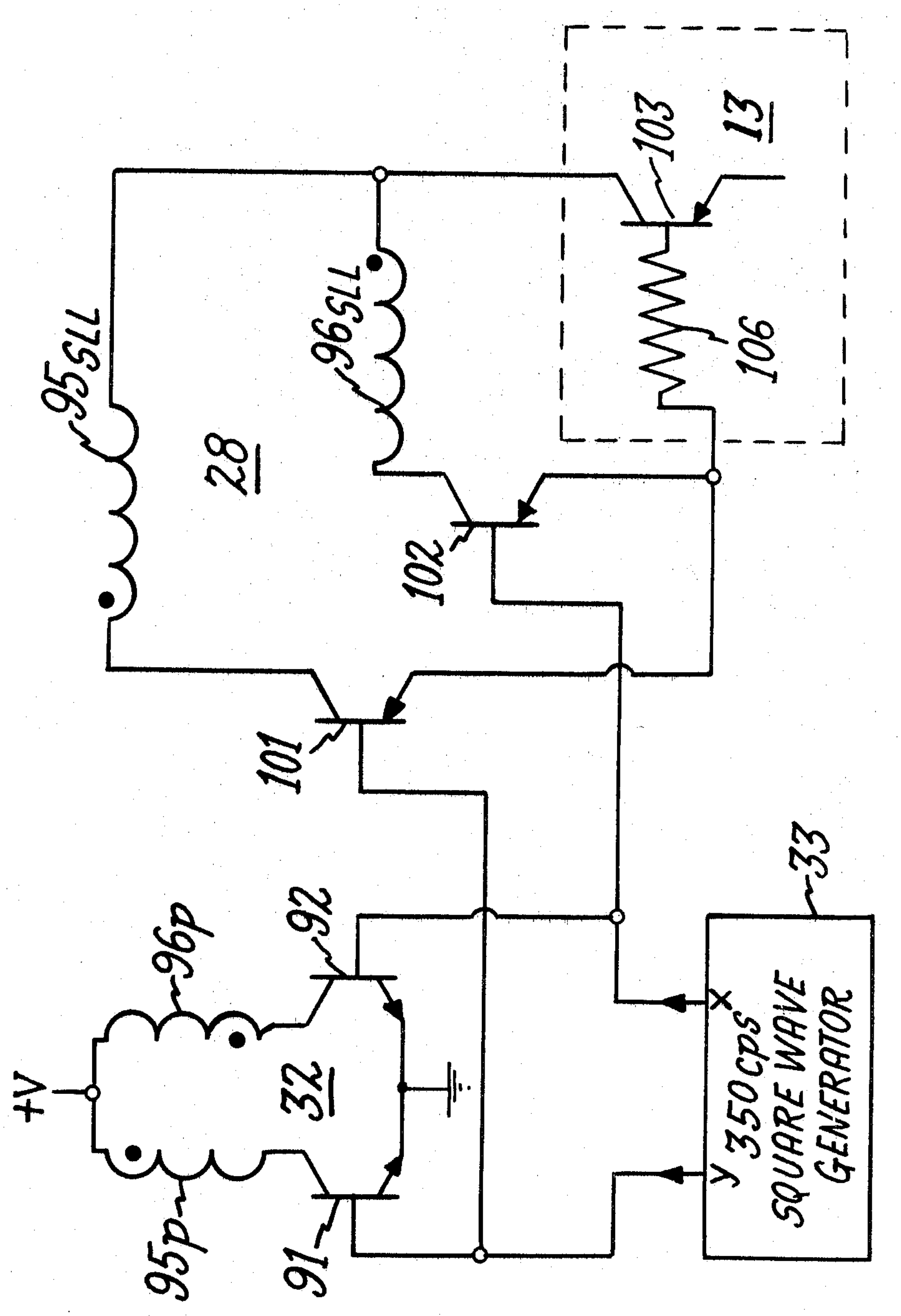
Figure 10:
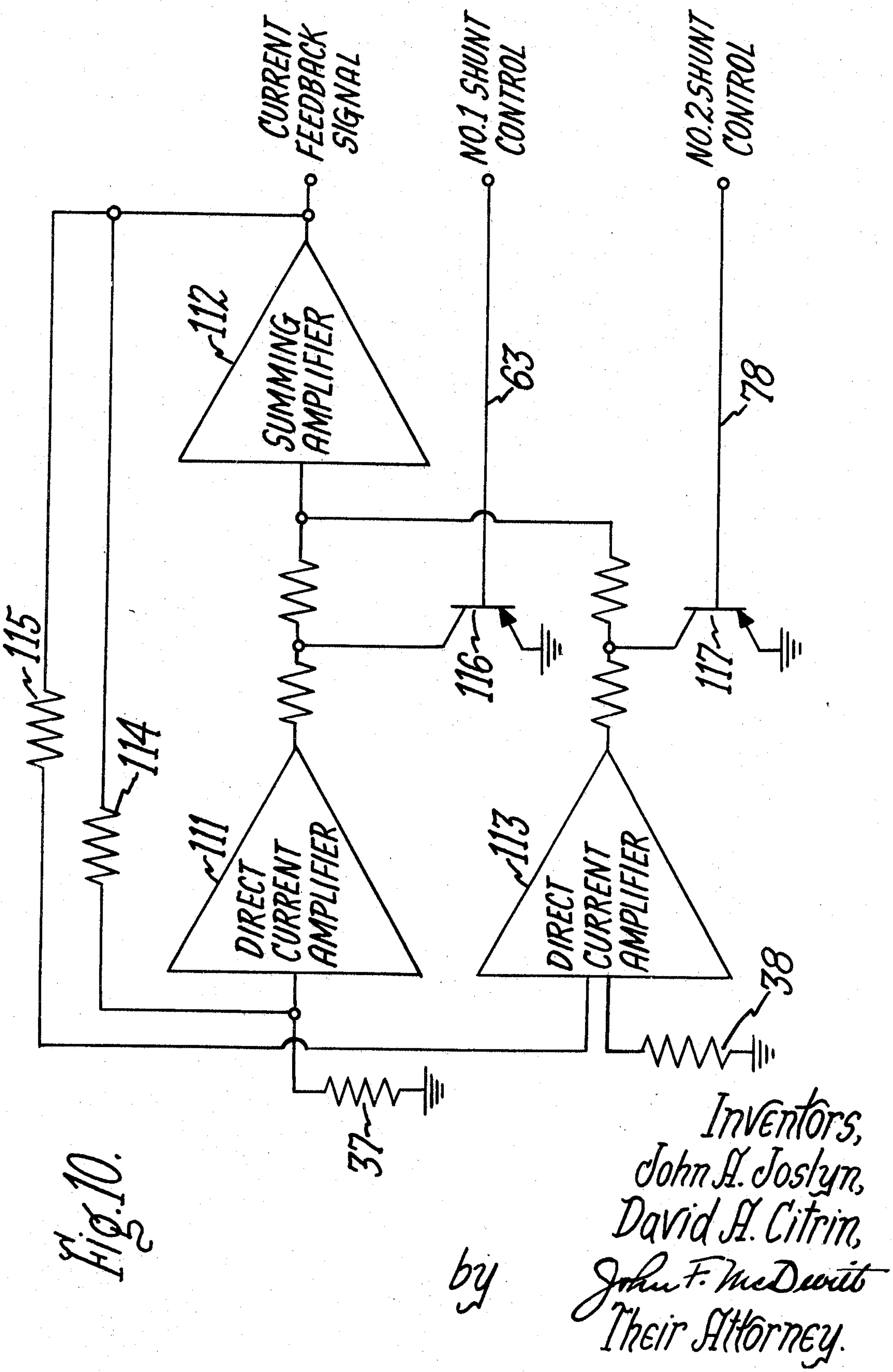

FIGS. 8*a* to 8*f* are a series of voltage versus time wave shapes which illustrate the operating characteristics of the driver amplifier circuit including the core driver all of which comprise a part of the overall servo amplifier system shown in FIG. 1;

FIG. 9 is a schematic circuit diagram of the novel compensation scheme employed in the driver amplifier arrangement for the power switching devices of the system shown in FIG. 1; and FIG. 10 is a schematic circuit diagram of the shunt current feedback signal deriving circuit arrangement employed in the system of FIG. 1 and comprising a part of the present invention.

The pulse width modulation switching power servo amplifier consists of two separately identifiable sections. One section is comprised by the low signal level electronics which converts the error signal received from the servo input to an error control pulse of varying width. The remaining section is comprised by the switching power amplifier which converts the turn on pulse to a high current high voltage power pulse capable of driving the servo motor. The low level electronics section is comprised by a power amplifier control, a square wave generator, a reference triangle generator, lock out circuits, low level upper and lower left corner logic circuit, and low level upper and lower right corner logic circuits. The high power section is comprised by a driver amplifier and the power transistors which constitute the active switching power elements of the circuit. The schematic circuit diagram of all of the low level and power level circuits are shown in FIGS. 3 through 10.

OVERALL POWER SWITCHING SERVO AMPLIFIER SYSTEM

The overall pulse width modulation power switching amplifier and mechanism is illustrated in block diagram form in FIG. 1 of the drawings. The servo motor being controlled is shown at 11 and is adapted to have its load terminals **11*a* and 11*b* connected alternately across a source of positive direct current voltage having a value of +28 volts. In FIG. 1 it is assumed that the negative terminal of the power source is grounded. In order to connect the load terminals 11*a* and 11*b* alternately across the power source, a bridge type switching power amplifier is provided which includes four controlled power semiconductor switching means 12 through 15 connected bridge fashion with the load and the power source. As will be described more fully hereinafter the controlled power semiconductor switching means 12 through 15 in fact comprise parallel connected switching power transistors all of which have control electrodes to which is applied appropriate turn on signals in accordance with the polarity and magnitude of an input error control signal supplied to the servo amplifier. The turn on control signal will cause either the power switching means 12 and 15 to be rendered conductive with 13 and 14 maintained off to thereby provide load current flow through motor 11 from terminal 11*a* to 11*b*, or alternatively, it will cause power switching means 13 and 14 to be rendered conductive with 12 and 15 maintained off to thereby cause load current flow through motor 11 from terminal 11*b* to terminal 11*a*. The periods of conduction of these sets of diagonally opposed power switching means are then pulse width modulated (i.e., pulse duration controlled) to determine the value of the current supplied to motor 11** thereby controlling its torque, speed, etc.

Because the current supplied to the motor 11 is pulsed in nature, it is necessary to provide some means for recirculating energy trapped in the winding of the motor 11 during intervals of nonconduction of the power switching means 12 through 15. For this purpose circulating diodes 16 through 19 are provided and are connected in reverse polarity parallel circuit relationship with respective ones of the gate controlled semiconductor power switching means 12 through 15. A bridge type switching power amplifier of this same general nature is disclosed in the above-identified copending General Electric application and at this time is relatively well known in the art. One of the worst known difficulties with a bridge type switching power amplifier of this nature occurs when both the upper and lower semiconductor power switching means on the same side of the bridge (for example 12 and 13) are rendered conductive simultaneously. In such instances a short circuit exists across the power supply which usually results in burning out one or more of the semiconductor power switching means.

In order to overcome the above mentioned difficulty the present invention provides corner logic circuit means operatively coupled to and controlling each of the power semiconductor switching means. The corner logic circuit means are comprised by an upper left corner logic circuit means 21, a lower left corner logic circuit means 22, an upper right corner logic circuit means 23 and a lower right corner logic circuit means 24. As might be surmised, the upper left corner logic circuit means 21 controls turn on and turn off of the upper left semiconductor power switching means 12, the lower left corner logic circuit means 22 controls turn on and turn off of the lower left semiconductor power switching means 13, the upper right corner logic circuit means 23 controls turn on and turn off of the upper right semiconductor power switching means 14, and the lower right corner logic circuit means 24 controls turn on and turn off of the lower right semiconductor power switching means 15. Operation of the upper and lower left corner logic circuit means 21 and 22 is in part controlled by a lock out circuit means 25 operatively intercoupling these two corner logic circuit means for preventing conduction of either the upper or lower semiconductor power switching means while the other is conducting and vice versa. Similarly, a lock out means 26 is intercoupled between the upper and lower right corner logic circuit means 23 and 24 to control the operation of these circuits in the same manner. Lock out is achieved in this fashion through suitable feedback inhibiting signals applied to and developed by the lock out circuit means 25 and 26.

The controlling output signals derived by each of the corner logic circuit means 21 through 24 are supplied through respective associated phase splitter and driver circuit means 27 through 30, respectively, to control the respective semiconductor power switching means 12 through 15. The phase splitter and driver circuit 27 through 30 in addition have supplied thereto large value pulsed turn on currents from a core driver circuit 32. The arrangement is such that the corner logic circuit means 21 through 24 control application of the pulse turn on signals in phase with the core driver 32 outputs to the semiconductor power switching means 12 through 15 in accordance with the incoming error control signal and the requirements of the lock out circuit means 25 and 26. The core driver 32 outputs provide a voltage whose polarity and magnitude partially compensates for the saturated voltage drop of the semiconductor power switching means. The core driver 32 is in turn controlled by the output from a square wave signal generator 33 that also excites a triangular wave form reference signal generator 34. The triangular wave form reference signal generator 34 supplies its output to one input of a power amplifier control circuit 35 also having the input error control signal supplied thereto. A threshold circuit means 36 is connected in common to each of the lower corner logic circuit means 22 and 24 and normally supplies bias signals to these corner logic circuit means such that in the absence of an error control signal to the input of the power amplifier control circuit 35, both lower semiconductor power switching means 13 and 15 are rendered conductive so as to in effect ground the input terminals of the servo motor 11.

Figure 2:
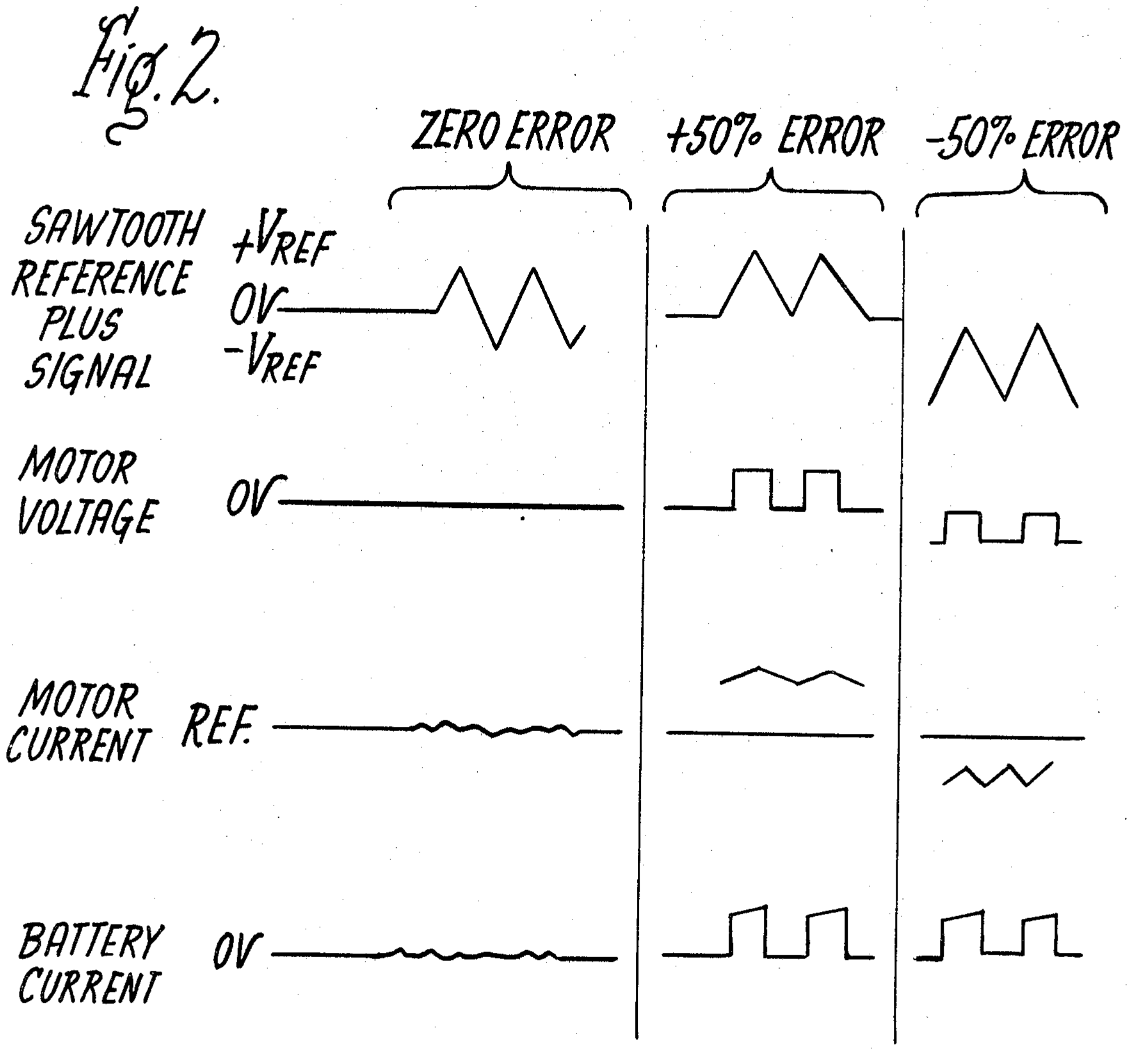
FIG. 2 illustrates a series of voltage and current versus time characteristic curves which portray certain of the operating characteristics of the circuit shown in FIG. 1.

In operation the triangular reference signal generated by circuit 34 is added to the error input signal in the power amplifier control circuit 35. FIG. 2 of the drawings illustrates the nature of the output signals from the power amplifier control circuit 35 for a condition of zero error input signal, plus 50% error input signal and minus 50% error input signal. The circuit is adjusted such that for zero error input signal as shown in the left hand column of FIG. 2, insufficient turn on potential is supplied to the bridge semiconductor power switching means to cause them to turn on so that the current through the motor 11 is maintained at substantially zero value. Upon the occurrence of a positive error signal, the triangular reference signal plus the error signal produces a positive switching component which exceeds the threshold value of the left lower corner logic circuit means 22. As a result the associated lower corner semiconductor power switching means 13 is turned off and the upper corner power switching means 12 on the same side of the bridge is turned on. The turn on of the power switching means 12 is delayed by the lock out circuit 25 until the lower corner power switching means 13 is fully off. Load current will then be supplied to the servomotor 11 through the upper left power switch 12 and the lower right power switch 15. Should the value of the triangular reference plus the input error signal increase, a greater period of conduction will occur thus pulse width modulating the average voltage supplied to the servomotor 11. Should the value of the triangular reference potential plus the error signal drop below the lower corner threshold value, the upper corner power switching means 12 will turn off and the lower corner power switch 13 will turn on. Here again the turn on of the lower power switch 13 will be delayed by the lock out circuit means 25 until the upper corner power switch 12 is fully off. The middle column in FIG. 2 illustrates the mode of operation.

In the event that the input error signal plus triangular reference is negative in nature, the lower right power switch 15 is turned off and the upper right power switch 14 is turned on by their associated corner logic circuit means 23 and 24 and phase splitter and driver means 29 and 30. This is accomplished in a similar manner to that described above for a positive error control signal to thereby provide pulse width modulated current flow in the reverse direction through the servomotor 11. This mode of operation is depicted by the right hand column of FIG. 2 of the drawings.

During operation of the pulse width modulation switching power servo amplifier in the above manner the phase splitter and driver circuit 27 through 30 help mechanize an electronic battery in the collector of the final driver stage which serves to reduce both stand-by losses and output power transistor dissipation as will be explained more fully hereinafter. Current feedback signals are developed across a pair of low value shunt resistors 37 and 38 having a value in the neighborhood of .2 to .5 of a milliohm and connected in each of the lower arms of the bridge arrangement. Since the motor current sometimes flows through both and sometimes through either of the shunt resistors 37 or 38, it is necessary to select which shunt will be used to supply a feedback signal for the system depending upon the status of the power amplifier. The shunt selection logic signals are generated in the lower left and upper left corner logic circuits 21 and 22 and as will be described more fully hereinafter. Briefly, however, it can be stated that the circuit is adjusted so that the left hand shunt 37 is used unless the upper left corner semiconductor power switching means 12 is energized in which event the right side shunt 38 is selected to provide feedback signals for the system.

To summarize, the switching power amplifier has the following three possible allowed states: For zero input error signal both the lower corner semiconductor switching means 13 and 15 are on and both upper corners 12 and 14 are off. With the circuit in this condition motor current can flow through one of the lower transistor switches 13 or 15 and the circulating diodes 19 or 17, respectively. For positive input error signal the upper left and lower right power switches 12 and 15 are on and the right upper and lower power switches 14 and 13 are off. For negative input error signal the right upper and left lower power switches 14 and 13 are on and the left upper and right lower power switches 12 and 15 are off. In either of the last two mentioned stages the motor current can flow through an upper transistor switch and a lower transistor switch or through two circulating diodes pumping power back to the 28 volt power supply bus.

Figure 3:
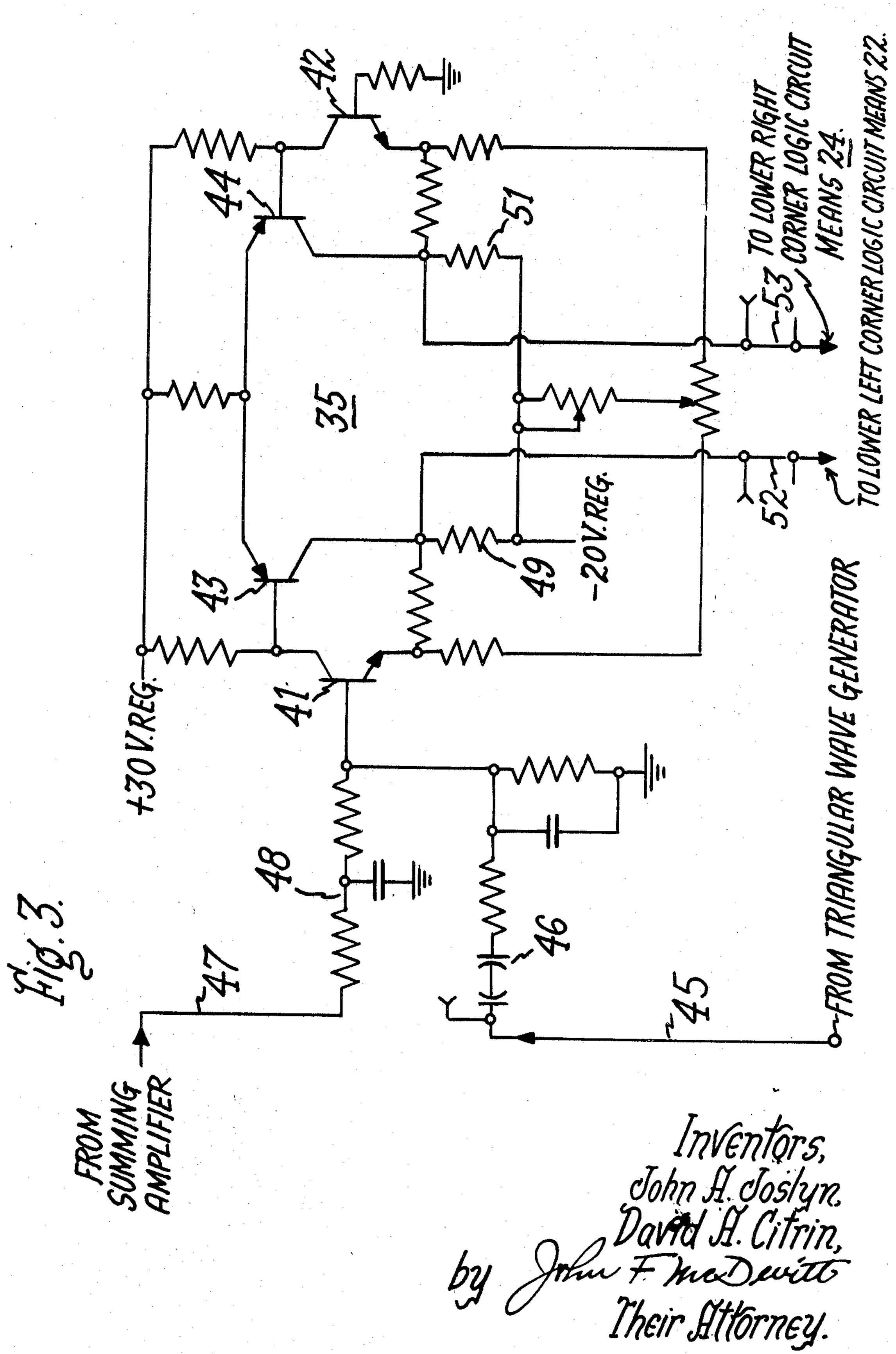
FIG. 3 is a detailed schematic circuit diagram of a power amplifier control circuit comprising a part of the overall servo amplifier system shown in FIG. 1.

The square wave clock pulse signal generator 33 and the triangular wave shape reference signal generator 34 are both conventional in construction, and hence are disclosed only in block diagram form. The circuit details of the power amplifier control circuit means 35 are illustrated in FIG. 3 of the drawings. The power amplifier control circuit 35 is comprised by a conventional four transistor differential amplifier consisting of two npn junction transistors 41 and 42 and two pnp junction transistor 43 and 44. The triangular wave shape reference potential is supplied through a conductor 45 and suitable capacitor coupling circuit 46 to the base of the npn junction transistor 41. The variable magnitude direct current error control voltage is supplied over a conductor 47 and through a resistor coupling network 48 to the base of the npn junction transistor 41. Two out of phase output signals from the power amplifier control 35 are derived across the load resistors 49 and 51 connected to the collectors of the pnp junction transistors 43 and 44. These output signals are supplied over the conductors 52 and 53 to the lower left corner logic circuit means 22 and the lower right corner logic circuit means 24, respectively, and represent the combined or summed error control signal and triangular reference potential.

Figure 4:
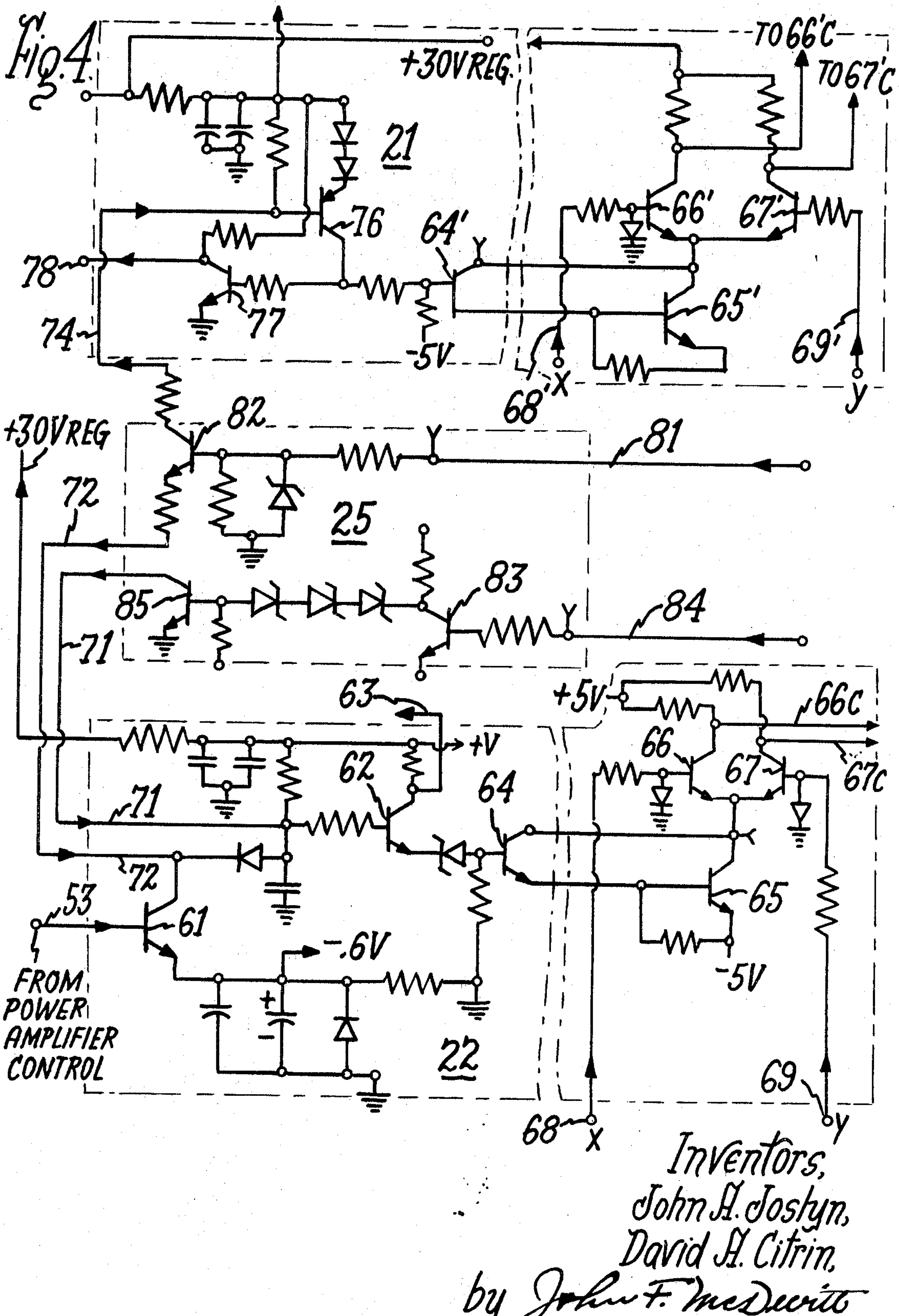
FIG. 4 is a detailed schematic circuit diagram of the upper and lower left hand corner logic circuit including a part of the phase splitter and driver circuit and the lock out circuit all comprising parts of the overall system of FIG. 1.

FIG. 4 of the drawings is a detailed schematic circuit diagram of the upper and lower left corner logic circuit means 21 and 22 and their associated lock out circuit means 25. The combined triangular reference and input error control signal supplied from the power amplifier control 35 is applied through the conductor 53 to the base of an input npn junction transistor 61 in the lower left logic circuit means 22. The emitter of the input transistor 61 is biased to a value of —.6 of a volt and as soon as the input error signal plus triangular reference appearing over conductor 53 reaches zero volts, transistor 61 turns on. As the input error signal increases, the on time of transistor 61 increases thereby increasing the pulse width of the power pulses applied to the load 11. Input transistor 61 has its collector connected to the base of a second stage transistor 62 that serves to invert and shape the output from input transistor 61. In addition the second stage transistor 62 functions to provide a current shunt selection signal over the conductor 63 for use in a manner to be described more fully hereinafter. The second stage transistor 62 is connected as an emitter follower amplifier and serves as a current amplifier for the lower left corner logic circuit means. The output from the emitter follower amplifier 62 is applied to the base of one transistor 64 of a dual darlington pair further comprised by a transistor 65. The dual darlington pair 64 and 65 drive a differential AND circuit comprised by a pair of transistors 66 and 67. For this purpose the dual darlington pair 64, 65 is connected in common to the emitters of the npn junction transistors 66 and 67. The transistors 66 and 67 have their base electrodes connected to the direct and inverse output terminals respectively of the source of square wave switching potential supplied to the terminals 68 and 69 respectively.

The differential AND gate circuit is the final signal level power stage which drivers the driver circuit means 28 for turning on the power switches. The differential AND gate means consists of the two transistors 66 and 67 and the control transistor 65 which comprises a part of and receives its signal from the dual darlington output 64, 65 of the lower left corner logic circuit means 22. When a turn-on enabling potential is supplied to the base of the transistor 65, it in turn will turn-on or enable the switching transistors 66 and 67. X and Y switching pulses generated by the square wave clock pulse signal generator 33 are present at the base electrodes of the switching transistors 66 and 67 at all times so that the presence of an enabling "on" potential supplied from transistors 65 to the emitters of transistors 66 and 67, allows these two transistors to be switched on and off by the square wave X and Y pulses supplied through terminals 68 and 69. Since the square wave X and Y pulses are out of phase, the switching transistors 66 and 67 are operable only 50% of the time and the turn on pulse to the driver amplifier is divided. The input to the driver amplifier then reconstructs this pulse in a manner to be described more fully hereinafter in connection with FIG. 5 of the drawings to provide a turn on signal to the power switching transistors.

In addition to the combined error control signal and triangular reference supplied over the conductor 53, the lower left corner logic circuit 22 receives a lock out signal over the conductor 71 from the lock out circuit means 25. When the logic in the lock out circuit means 25 supplies a zero volt signal over the conductor 71 to the base of the second stage transistor 62, the lower corner logic circuit 22 is inhibited from operation. When this signal goes to some finite positive voltage value, the lower left corner logic circuit 22 is allowed to operate and will turn on if the combined triangular input and error control signal value is below the zero volt threshold value. An operating potential is supplied from the lower left corner of logic circuit 22 over the conductor 72 to the lock out circuit means 25. If the lower left corner power switching transistor means 13 is off, this signal will operate the upper left corner logic circuit 21 to cause the upper left switching power transistors 12 to turn on in the presence of an input positive error command signal to the servo amplifier.

The upper left corner logic circuit 21 is comprised by a first stage transistor 76 having its base connected to a conductor 74 that is supplied with an input signal from the lock out circuit means 25. The first stage transistor 76 functions as an inverter circuit for inverting the input potential received over conductor 74. The input potential received over conductor 74 in effect comprises a turn on potential derived from the lower left corner logic circuit 22. The output from the first stage inverter 76 drives a second stage inverter 77 which reinverts and amplifies the signal potential and supplies the resulting potential over an output conductor 78 for use as a second current shunt selection logic signal as will be described more fully hereinafter in connection with FIG. 10. The output from input transistor 76 is also supplied to the base of a first transistor 64' of a dual darlington pair further comprised by a transistor 65'. The dual darlington pair 64', 65' drive a differential AND circuit comprised by a pair of switching transistors 66' and 67' having their base electrodes supplied with square wave switching potentials X and Y through conductors 68' and 69'. The dual darlington pair 64', 65' and the differential AND circuit 66', 67' function in precisely the same manner as the correspondingly numbered elements of the lower left corner logic circuit 22 to develop square wave turn on switching pulses that are applied to the upper left phase splitter and driver circuit 27 of the servo power amplifier.

The purpose of the lock out circuit means 25 is to prevent a cross fire in the switching power amplifier whereby short circuiting of the power source might occur. This is accomplished through the use of two separate circuits comprising parts of the lock out circuit means 25. When the lower left switching power means 13 is on, a substantially zero volt inhibiting potential is supplied through the conductor 81 to the base of an upper lock out transistor 82 which maintains the transistor 82 turned off. This in effect essentially opens the circuit to the upper left corner logic circuit 21 so that no turn on pulses are supplied to the input transistor 76. When the lower left corner switching power transistor 13 is off, upper lock out transistor 82 is turned on and allows input pulses to propagate to the base of input transistor 76 in the upper left logic circuit 21. Thus, it will be appreciated that lock out of the upper left switching power transistor is achieved while the lower left switching power transistor is on.

The second part of the lock out circuit means 25 is comprised by a lower lock out transistor 83 having its base electrode connected through a conductor 84 to a source of inhibiting potential supplied by the upper left switching power means 12. When the upper left corner switching power transistors 12 are on, the lower lock out transistor 83 is turned off. Turn off of transistor 83 results in turning on a transistor 85 having its collector connected through the conductor 71 to the base of the second stage transistor 62 in the lower left logic circuit 22. Turn on of the transistor 85 causes a zero volt inhibiting potential to be applied to the base of the second stage transistor 62 in the lower left logic circuit 22 preventing it from operating. Thus, when the upper switching power transistors 12 are conducting, the lower switching power transistors 13 are prevented from turning on by the positive lock out achieved through transistors 83 and 85 and their appropriate connecting conductors. When the upper left switching power transistors 12 are off, a positive enabling potential is supplied through conductor 84 to the base of transistor 83 which causes this transistor to be turned on and the transistor 85 to be turned off. Turn off of transistor 85 allows the second stage transistor 62 of the lower left logic circuit means 22 to operate.

Figure 6:
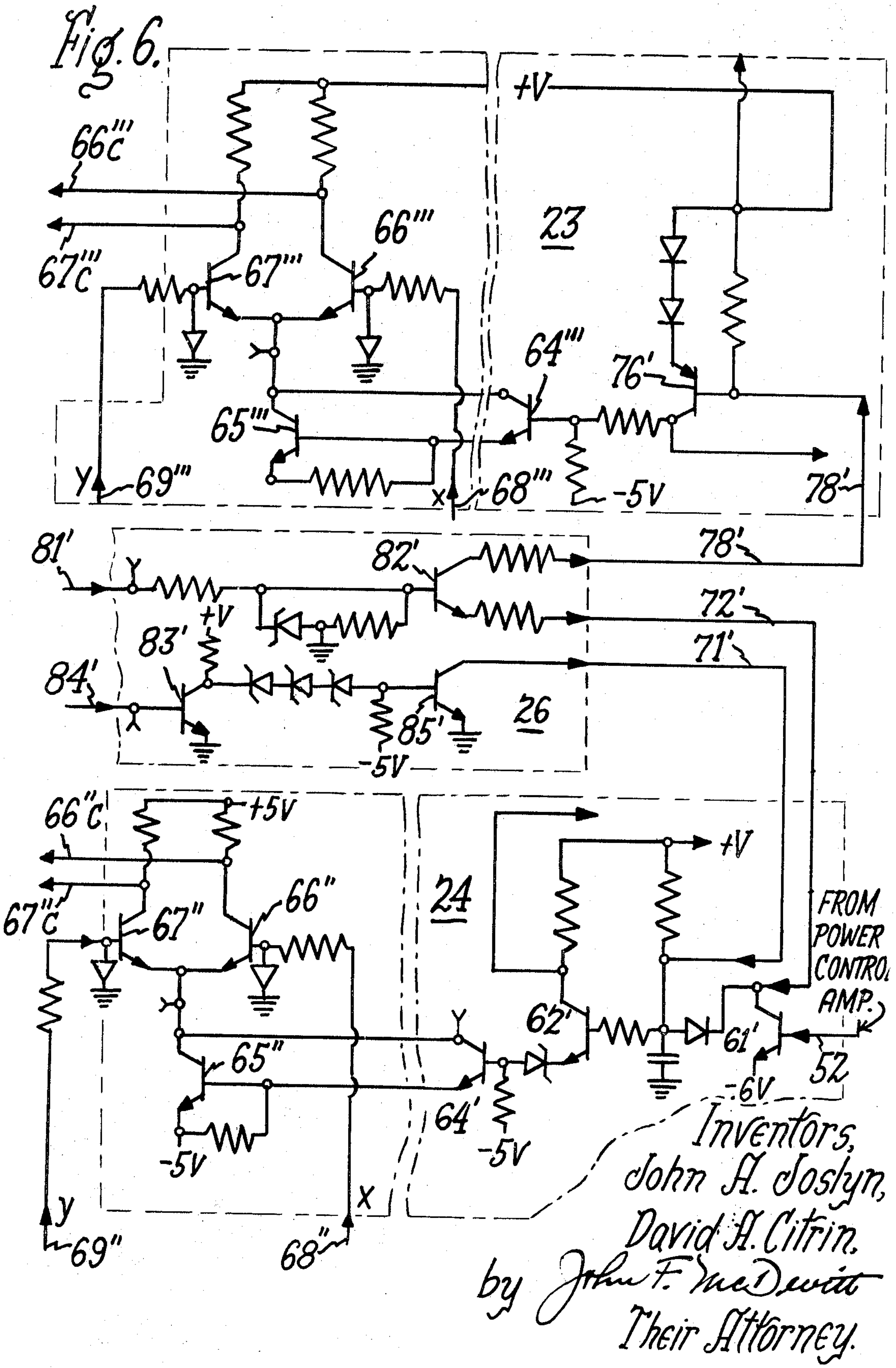
FIG. 6 is a detailed schematic circuit diagram of the upper and lower right hand corner logic circuits including phase splitter and driver circuits and right hand lock out circuit all comprising parts of the overall servo amplifier system shown in FIG. 1.

FIG. 6 of the drawings is a detailed schematic circuit diagram of the upper right corner logic circuit 23, the lock out circuit 26 and the lower right corner logic circuit 24. Because each of these circuits are similar in construction and operate in a manner similar to their counterparts on the left hand side of the switching power amplifier, a further description of the construction and manner of operation of these circuit portions is believed unnecessary. It need be only noted that the combined input error control signal and triangular reference switching potential supplied from the power amplifier control 35 over conductor 52 to the base of the input transistor 61′ of the lower right logic circuit 24 is negative going in polarity in contrast to the positive polarity combined error signal and reference potential supplied to the lower left logic circuit 22. Thus, the two sets of circuits operate on different polarity signals otherwise the construction and operation of the circuits are similar.

Figure 7:
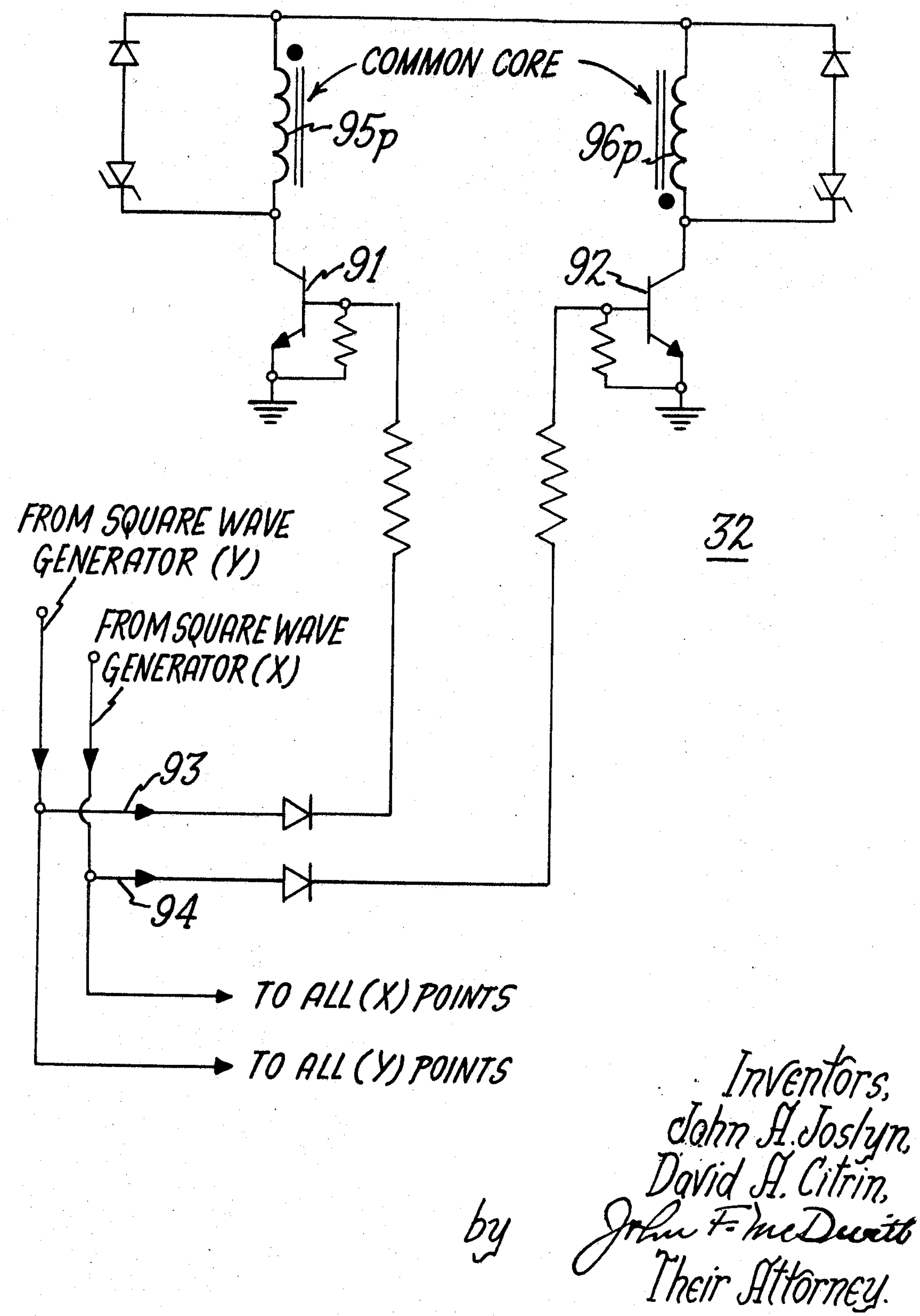
FIG. 7 is a detailed schematic circuit diagram of the core driver circuit comprising a part of the system shown in FIG. 1.

FIG. 7 of the drawings illustrates the details of construction of the core driver 32. The core driver 32 is comprised by a pair of npn junction transistors 91 and 92 each having their emitter electrodes grounded. The base electrode of the transistor 91 is connected through a terminal 93 to one output terminal of the square wave generator 33 and the base of transistor 92 is connected through a conductor 94 to the remaining or inverse output terminal of the square wave generator 33. By this arrangement it will be noted that what has been heretofore identified as the X and Y outputs of the square wave generator are applied to the bases of the transistors 92, 91, respectively. The collector of switching transistor 91 is connected through the primary winding $95_p$ of a pulse transformer to a source of positive bias potential and the collector of transistor 92 is connected through a primary winding $96_p$ on the same transformer core to the same source of supply potential. As a consequence of this arrangement, upon either of the switching transistors 91 or 92 being gated on by the application of the square wave X, Y potentials to the base electrode thereof, voltage pulses will be generated across the primary windings $95_p$ or $96_p$ which are substantially out of phase with the respective X, Y square wave potentials used to gate on the transistors 91 and 92. The substantially square wave gating current pulses thus produced will induce similar square wave gating pulses in the secondary windings of the pulse transformers which are inductively coupled to the primary windings 95 and 96.

Figure 5:
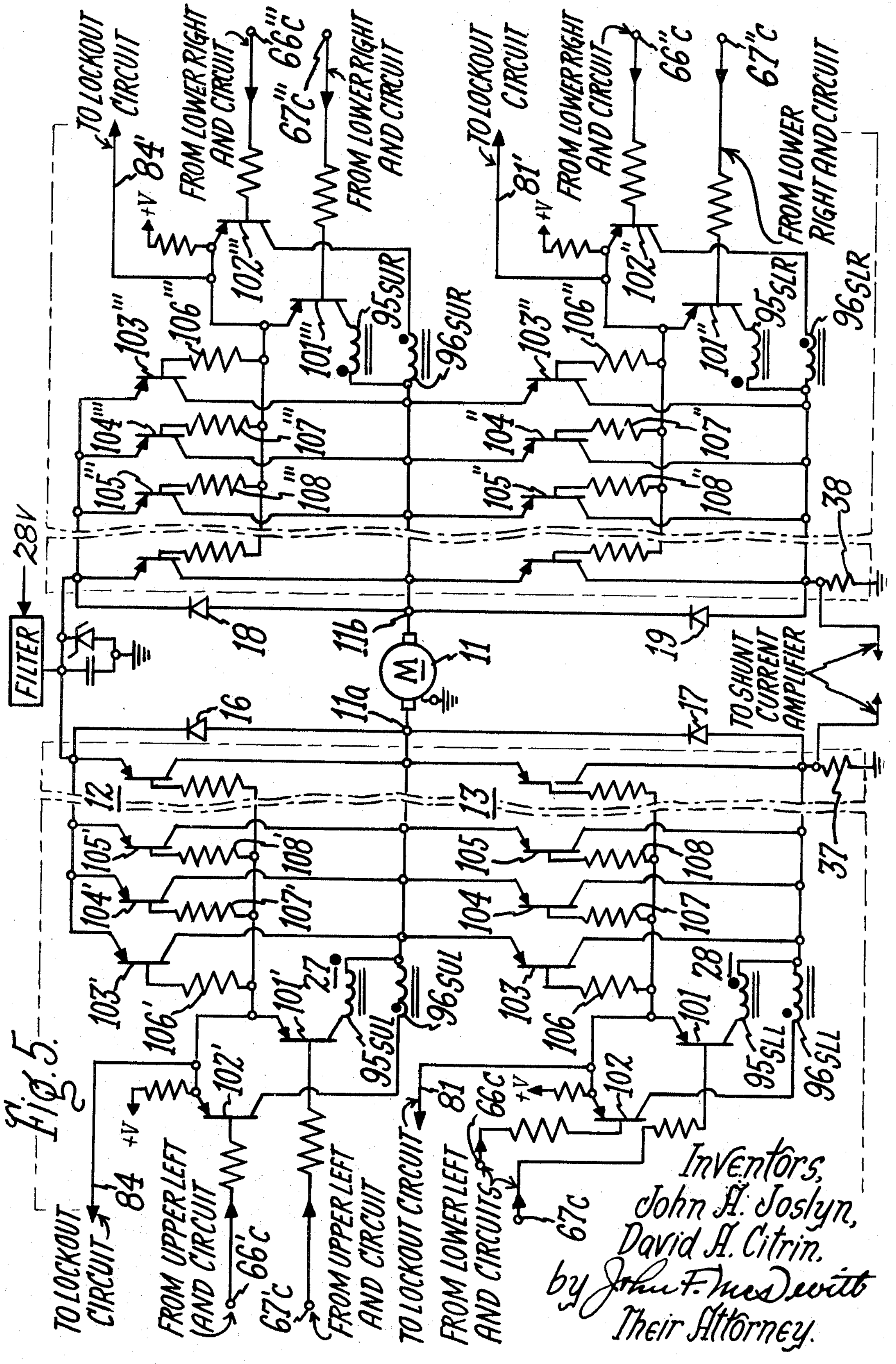
FIG. 5 is a detailed schematic circuit diagram of the bridge connected power switching elements comprising a part of the overall servo amplifier system shown in FIG. 1.

The voltage pulse transformers whose primary windings are shown at $95_p$ and $96_p$ in FIG. 7 may comprise voltage step down transformers whose secondary windings are connected in the collector circuits of the driver transistors 12 through 15 shown in FIG. 5 of the drawings.

Referring to the upper left corner of the circuit diagram shown in FIG. 5 of the drawings, the manner of connection of the two secondary windings $95_{SUL}$ and $96_{SUL}$ to the turn on or base electrodes of the semiconductor power switching transistors 12, is illustrated. Since this connection is similar for all of the semiconductor power switching transistors 12 through 15, it is believed necessary to describe only the arrangement with relation to the semiconductor power switches 12. For the same reason the elements comprising the turn on circuits of each of the several power switching transistors have been given the same reference numeral primed, double primed or triple primed. The secondary winding $95_{SUL}$ is connected in series with the emitter collector of a switching transistor 101′ and the series circuit thus comprised is connected in parallel with a second series circuit comprised by the secondary winding $96_{SUL}$ and a second switching transistor 102′. The parallel circuit thus formed in fact comprises a darlington emitter follower and is connected across the base collectors of a plurality of pnp germanium switching power transistors 103, 104, 105, etc. through suitable load current sharing resistors 106, 107, 108, etc. The base of each of the switching driver transistors 101 and 102 is connected through conductors $67_c'$ and $66_c'$, respectively, to the output of the differential AND circuit 66′, 67′ in the upper corner logic circuit means 21 shown in FIG. 4 of the drawings. It should be noted that while only three parallel connected germanium power switching transistors 103 through 105 have been illustrated, any number of such transistors can be connected in parallel to form a power switching transistor stick having a desired current rating necessary to control the servo motor 11.

From a consideration of the parallel connected power transistors 103′ through 105′ it will be noted that the emitter collectors of these transistors serve to connect one load terminal **11*a* of the servo motor 11 to the positive terminal of the direct current power supply. A similar number of parallel connected power switching transistors 103 through 105 serve to connect the same load terminal 11*a* to the negative terminal of the power supply through the shunt resistor 37. In a similar manner, the parallel connected power switching transistors 103‴ through 105‴ and the parallel connected power switching transistors 103″ through 105″ serve to connect the remaining load terminal 11*b* of servo motor 11 to the positive and negative terminals, respectively, of the power supply through the emitter collectors thereof. The resistors 106 through 108** in each set of parallel connected power switching transistors serve to aid load current sharing amongst all the transistors forming the parallel connected transistor stick.

The operation of the core driver 32 and the associated driver amplifier 101, 102 can be best understood in connection with FIGS. 8 and 9 of the drawings wherein FIG. 9 is intended to depict the driver amplifier circuit arrangement for the lower left corner. The purpose of the driver amplifier arrangement is to improve the performance and overall efficiency of the power switching amplifier by providing a compensating voltage which offsets the base-emitter saturation voltage of the switching power transistors 103, 104, etc. The compensating voltage is derived in a unique low power fashion by means of the transformer connection. The transformer connection is such that the primary winding does not have to handle the full secondary power, and the direct current in the secondary does not saturate the transformer core because it is balanced and of opposite polarity in the two secondary windings.

Figure 8A:
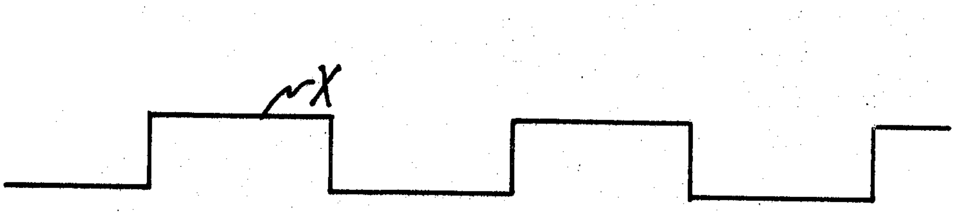
Figure 8B:
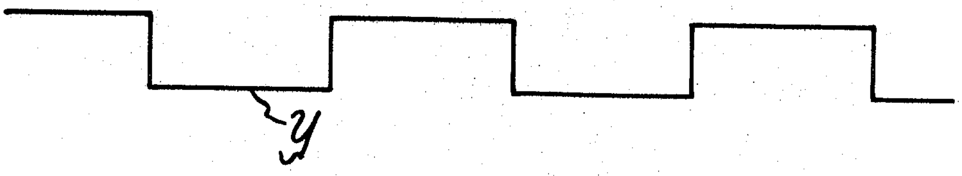

The operation of the core driver and driver amplifier arrangement is as follows. As stated earlier in connection with the description of the differential AND circuit in each of the corner logic circuit means 21 through 24, the switching transistors 66 and 67 have the X, Y square wave potential applied to the base thereof through terminals 68 and 69, respectively, and serve to divide the controlling turn-on pulses into two parts. This mode of operation is best depicted by the curves shown in FIG. 8 of the drawings. It will be noted that polarity references in FIG. 8 are for purposes of illustration only. FIGS. 8*a* and 8*b* illustrate the waveform of the square wave switching potential X and Y which not only are applied to the differential AND circuit 66, 67 but are also applied to the base electrodes of the switching transistors 91 and 92 in the core driver 32. Therefore, in effect the X, Y switching potential are supplied through the differential AND circuit 66, 67 to the base electrode of the switching transistors 101 and 102 in the driver amplifier arrangement.

Figure 8C:
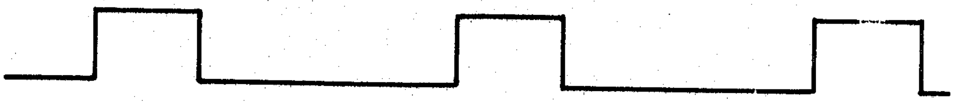
Figure 8D:
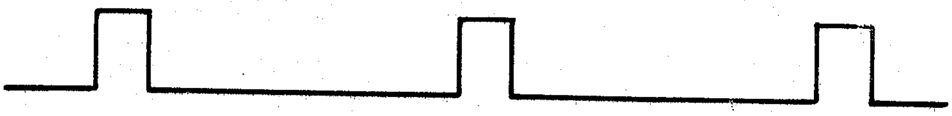
Figure 8E:
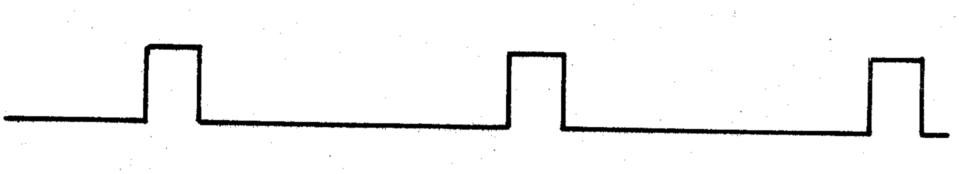
Figure 8F:
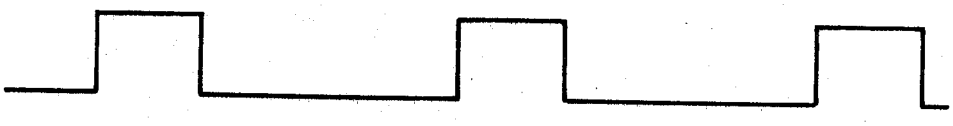

This is best seen in FIG. 9 of the drawings where for convenience of illustration the differential AND circuit has been omitted. From a consideration of FIG. 9 it will be seen that the switching transistor 101 in the driver amplifier arrangement will have a turn on potential applied to the base electrode thereof concurrently with the application of a voltage potential developed across the secondary winding $\mathbf{95}_{SLL}$. Similarly, the switching transistor 102 has a turn on pulse applied to its base electrode concurrently with the application of a voltage potential developed across the secondary winding $\mathbf{96}_{SLL}$. It should be remembered that the total time duration or pulse width of the turn-on pulses being applied to the base electrodes of the switching transistors 101 and 102 is determined by the pulse width duration of the combined input error and triangular reference signal as shown in FIG. 8*c*. However, because of the divide by two action of the differential AND circuit 66, 67 in the corner logic circuit means, these two pulses are divided into two out of phase components as shown in FIGS. 8*d* and 8*e* of the drawings. It will be appreciated therefore that the driver switching transistors 101 and 102 in conjunction with their associated secondary windings $\mathbf{95}_{SLL}$ and $\mathbf{96}_{SLL}$, respectively, serve to recombine and amplify the turn-on current pulse and to produce the reconstructed pulse as shown in FIG. 8*f* of the drawings. It is this reconstructed turn-on pulse that is applied to the base of the pnp power switching transistors 103, 104, etc.

From a consideration of FIG. 9 of the drawings it will be appreciated that the voltage developed across the secondary windings $\mathbf{95}_{SLL}$ and $\mathbf{96}_{SLL}$ is in opposition to the voltage drop normally occurring across each of the power switching transistors 103, 104, etc. The voltage drop appearing across each of the power switching transistors is given by the expression $$V_{\text{switch}}=V_{\text{CES}}+V_{\text{BE}} \qquad (1)$$

the value given by expression (1) normally is in the neighborhood of 1.3 to 1.4 volts for switching power transistors of the size and rating envisioned. By use of the present technique, expression (1) is reduced by subtracting therefrom the drop across the transformer secondary winding and results in a value $$V_{\text{switch}}=V_{\text{CES}}+V_{\text{BE}}-V_{\text{transformer}} \qquad (2)$$

which is equal to 1.3–.6 or .7 volt. Thus, it will be appreciated that the compensating techniques reduces the switch voltage drop almost in half. In terms of power dissipation the power lost in the switching power transistors is reduced from 1.5 kilowatts to .8 kilowatt at the peak current rating.

From a consideration of FIG. 5 of the drawings, it will be appreciated that depending on which half of the switching power amplifier arrangement is conducting, all of the current will flow through either one or both of the shunt resistors 37 and 38. The shunt resistors 37 and 38 provide feedback signals for stabilizing the overall servo amplifier system of which the switching power amplifier is a part. The manner in which the feedback signal is derived, is illustrated in FIG. 10 of the drawings wherein the two shunt resistors are shown at 37 and 38. The signal developed across the shunt resistor 37 is amplified by a conventional resistor coupled direct current non-inverting amplifier 111 and applied to the input of a summing amplifier 112. The signal developed across the shunt resistor 38 similarly is amplified by a direct current inverting amplifier 113 and applied to the input of the summing amplifier 112. Feedback paths may be provided from the output of the summing amplifier 112 through resistor 114 to the input of the amplifier 111 and through resistor 115 to the input of amplifier 113. The output of amplifier 111 is coupled to the input of summing amplifier 112 across a shunting transistor 116 having its emitter-collector connecting the output of amplifier 111 to ground and having its base connected to the conductor 63. Similarly, the output of the amplifier 113 is connected across a shunting transistor 117 having its emitter-collector connecting the output of amplifier 113 to ground and having its base connected to a conductor 78. As was described with relation to FIG. 4 of the drawings the conductors 63 and 78 are supplied with shunt current selecting enabling potentials which cause the shunting transistors 116 and 117 to turn on or off depending upon the mode of operation of the switching power amplifier. Thus it will be appreciated that when the shunting transistor 116 is enabled to turn on by a potential supplied from conductor 63, the output from amplifier 111 will be shunted to ground, and only the output from amplifier 113 will be supplied through the summing amplifier 112 for use as a current feedback signal in the servo power amplifier system. Alternately, when the shunting transistor 117 is turned on by an enabling potential supplied over conductor 78, the output from amplifier 113 is shunted to ground and only the amplifier 111 supplied its output to summing amplifier 112 for use as the current feedback signal. The current feedback signal thus derived may be fed back into the servo amplifier system at any appropriate point preferably ahead of the power amplifier control 35. It can be appreciated therefore that the circuit serves to select an appropriate one of the shunt resistors 37 or 38 to provide a desired feedback signal to the servo amplifier system for stabilization purposes.

From the foregoing description it will be appreciated that the invention provides a new and improved pulse width modulation switching power servo amplifier of the bridge type which includes features for preventing misconduction of the active power switching elements of the bridge, a new pulse turn on circuit arrangement providing compensation for the saturation voltage of the active power switching elements of the bridge, and an improved feedback signal deriving arrangement for developing a feedback signal for system stabilization purposes. These features are made possible by the provision of a positive lock out between the upper and lower corners of a bridge type switching power servo amplifier to prevent misfiring and short circuit conditions. In addition the invention includes a novel compensating driver circuit for power semiconductor switching devices which compensates for at least part of the saturated voltage of such devices and further includes a novel shunt feedback signal deriving arrangement for deriving suitable feedback signals for control of the servo amplifier system.

Having described one embodiment of a new and improved pulse width modulation bridge type switching power servo amplifier constructed in accordance with the invention, it is believed obvious that other modifications and variations of the present invention will be made possible in the light of the above teachings. It is therefore to be understood that changes may be made in the particular embodiment of the invention described which are within the full intended scope of the invention as defined by the appended claims.

What we claim as new and desire to be secured by Letters Patent in the United States is:

1. In a pulse width modulation switching power amplifier of the bridge type having at least four controlled power semiconductor switching means connected in bridge fashion with a load and a power source for coupling the load across alternate output terminals of the output source in accordance with the polarity and magnitude of an input control signal, the improvement comprising corner logic circuit means operatively coupled to and controlling each of the power semiconductor switching means, and lockout circuit means operatively intercoupling the corner logic circuit means of the upper and lower power semiconductor switching means on the same side of the bridge for preventing conduction of one while the other is conducting vice versa, said lockout circuit means including means to monitor the conductive state for individual power semiconductor switching means so as to generate an inhibit signal input to said lockout circuit means when said individual semiconductor switching means are conducting.

2. A switching power amplifier according to claim 1 wherein each of the corner logic circuit means is comprised by inhibit circuit means operatively controlled by the combined action of the input control signal and the lockout circuit means, AND circuit means operatively coupled to the output from inhibit circuit means and to a reference source of switching potentials for deriving output turn-on signals for application to the control electrode of an associated power semiconductor switching means.

3. A switching power amplifier according to claim 2 further comprising driver amplifier means operatively coupling the output from the AND circuit means to the control electrode of an associated power semiconductor switching means.

4. A switching power amplifier according to claim 3 wherein the AND circuit means is a differential AND circuit means for deriving a pair of complementary turn-on signals and the driver amplifier means is comprised by a pair of parallel connected switching transistors for recombining the complementary turn-on signals and applying the combined signal to the control electrode of the associated power semiconductor switching means.

5. A switching power amplifier according to claim 4 wherein each of the switching transistors has its emitter-collector connected in series circuit relationship with a respective secondary winding of a pulse transformer across the control gate collector of the associated power semiconductor switching means, the secondary windings being inductively coupled to respective primary windings supplied with pulsed excitation voltages substantially in phase with the reference switching potentials supplied to the differential AND circuit means.

6. A switching power amplifier according to claim 5 wherein a compensating voltage is developed across the secondary windings of the pulse transformer which offsets the control electrode-emitter saturation voltage of the power semiconductor switching means.

7. A switching power amplifier according to claim 6 wherein a feedback signal deriving shunt impedance is connected in at least two adjacent legs of the bridge for deriving a feedback signal for system stabilization purposes irrespective of the direction of current flow through the load, summing amplifier means having the feedback signal derived across each of said shunt impedances supplied thereto for selecting and utilizing one of the shunt derived signals as a system feedback signal, and shunt control means operatively coupled across the input of said summing amplifier means in parallel with the respective feedback signals for selectively passing one of the feedback signals to the summing amplifier means as determined by the mode of operation of the amplifier.

8. A switching power amplifier according to claim 7 wherein the shunt control means comprises a pair of switching transistors having their emitter-collectors connected in parallel with the input to the summing amplifier means and having the base electrodes thereof controlled by respective corner logic circuit means for selecting the feedback signal to be passed to the summing amplifier means in accordance with power semiconductor switching means selected for conduction.

9. A servo mechanism comprised by a switching power amplifier according to claim 8 wherein the load comprises a servo motor and is further characterized by circulating diodes connected in reverse polarity, parallel circuit relationship with each of the controlling power semiconductor switching means for circulating energy trapped in the motor winding during non-conducting intervals of the respective associated power semiconductor switching means.

10. In a switching power amplifier utilizing controlled power semiconductor switching devices having control electrodes, the improvement comprising driver amplifier means for operatively coupling turn-on switching signals to the control electrodes of the power semiconductor switching devices, differential circuit means for deriving a pair of complimentary turn-on signals from a reference source of switching signals and the input control signal, the driver amplifier means being comprised by a pair of parallel connected switching transistors such that each switching transistor is supplied with a different complementary turn-on signal for recombining the complementary turn-on signals supplied hereto from the differential circuit means and applying the combined signal to the control electrode of an individual power semiconductor device.

11. A switching power amplifier according to claim 10 wherein each of the switching transistors has its emitter-collector connected in series circuit relationship with a respective secondary winding of a pulse transformer across the control gate-emitter of the associated power semiconductor switching device, the secondary windings being inductively coupled to respective primary windings supplied with pulsed excitation voltages substantially in phase with the reference switching potentials supplied to the differential circuit means.

12. A switching power amplifier according to claim 5 wherein a compensating voltage is developed across the secondary windings of the pulse transformer which offsets the control electrode-emitter saturation voltage of the power semiconductor switching devices.

13. In a pulse width modulation switching power amplifier of the bridge type having at least four controlled power semiconductor switching means connected bridge fashion with a load and a power source for coupling the load across alternate output terminals of the power source in accordance with the polarity and magnitude of an input control signal the improvement comprising a feedback deriving shunt impedance connected in at least two adjacent legs of the bridge for deriving a feedback signal for system stabilization purposes irrespective of the direction of current flow through the load, summing amplifier means having the feedback signal derived across each of said shunt impedances supplied thereto for selecting and utilizing one of the shunt derived signals as a system feedback signal, and shunt control means operatively coupled across the input of said summing amplifier means in parallel with the respective feedback signals for selectively passing one of the feedback signals to the summing amplifier means as determined by the mode of operation of the switching power amplifier.

14. A switching power amplifier according to claim 13 wherein the shunt control means comprises a pair of switching transistors having their emitter-collectors connected in parallel with the input to the summing amplifier means and having the base electrodes thereof controlled by suitable logic circuit means for selecting the feedback signal to be passed to the summing amplifier means in accordance with power semiconductor switching means selected for conduction.

References Cited

UNITED STATES PATENTS

| | | | |
|---|---|---|---|
| 3,260,912 | 7/1966 | Gregory | 318—341 |
| 3,308,307 | 3/1967 | Moritz | 318—18 |
| 3,309,592 | 3/1967 | Faure | 318—341 XR |
| 3,354,371 | 11/1967 | Ainsworth et al. | 318—341 |

BENJAMIN DOBECK, Primary Examiner

U.S. Cl. X.R.

318—28, 341